(12) United States Patent
Johnson et al.

(10) Patent No.: US 10,338,150 B2
(45) Date of Patent: Jul. 2, 2019

(54) SYSTEMS AND METHODS FOR ESTIMATING BATTERY SYSTEM ENERGY CAPABILITY

(71) Applicant: GM GLOBAL TECHNOLOGY OPERATIONS LLC, Detroit, MI (US)

(72) Inventors: Kurt M. Johnson, Brighton, MI (US); Brian J. Koch, Berkley, MI (US)

(73) Assignee: GM Global Technology Operations LLC., Detroit, MI (US)

( * ) Notice: Subject to any disclaimer, the term of this patent is extended or adjusted under 35 U.S.C. 154(b) by 737 days.

(21) Appl. No.: 14/491,737

(22) Filed: Sep. 19, 2014

(65) Prior Publication Data
US 2016/0084910 A1  Mar. 24, 2016

(51) Int. Cl.
*G01R 31/36* (2019.01)
*G01R 31/3835* (2019.01)
*G01R 31/367* (2019.01)

(52) U.S. Cl.
CPC ..... *G01R 31/3835* (2019.01); *G01R 31/3648* (2013.01); *G01R 31/367* (2019.01)

(58) Field of Classification Search
CPC .............. G01R 31/363; G01R 31/3648; G01R 31/3624; G01R 31/3662; G01R 31/362
USPC .......................................................... 702/63
See application file for complete search history.

(56) References Cited

U.S. PATENT DOCUMENTS

| | | | | |
|---|---|---|---|---|
| 2002/0093312 A1* | 7/2002 | Choo | ................. | G01R 31/3624 320/149 |
| 2007/0170892 A1* | 7/2007 | Ishii | ................... | G01R 31/3648 320/132 |
| 2008/0065301 A1* | 3/2008 | Sheidler | ................... | B60K 6/48 701/54 |
| 2010/0039054 A1* | 2/2010 | Young | ....................... | H02P 4/00 318/376 |
| 2010/0292880 A1* | 11/2010 | McGrogan | ............... | B60K 6/48 701/22 |
| 2013/0030739 A1* | 1/2013 | Takahashi | .......... | G01R 31/3658 702/63 |
| 2014/0152317 A1* | 6/2014 | Baraszu | ............... | G01N 27/416 324/433 |

(Continued)

FOREIGN PATENT DOCUMENTS

| | | |
|---|---|---|
| CN | 1132355 A | 10/1996 |
| CN | 1715944 A | 1/2006 |
| JP | 2014-107168 | * 6/2014 |

OTHER PUBLICATIONS

English Abstract of JP 2014-107168, Jun. 2014.*
Machine translation of CN1715944A (11 pgs). 2006.
Machine translation of CN1132355A (14 pgs). 1996.

*Primary Examiner* — Michael P Nghiem
(74) *Attorney, Agent, or Firm* — Quinn IP Law (57) ABSTRACT

System and methods for determining battery system energy capability in a vehicle are presented. A voltage offset of a battery system may be determined based on comparison of an open circuit voltage of the battery system and a measured voltage. An estimated remaining pack energy may be determined based, at least in part, on the voltage offset. Similarly, an estimated total pack energy may be determined based, at least in part, on the voltage offset. An energy capability of the battery system may be determined based on the estimated remaining pack energy and the estimated total pack energy.

20 Claims, 5 Drawing Sheets

(56) References Cited

U.S. PATENT DOCUMENTS

| | | | | |
|---|---|---|---|---|
| 2014/0368208 A1* | 12/2014 | Yamada | ................ | H01M 10/48 324/433 |
| 2015/0028814 A1* | 1/2015 | Johnson | ................... | H02J 7/00 320/134 |
| 2015/0219726 A1* | 8/2015 | Lenz | ................. | G01R 31/3606 702/63 |
| 2015/0268307 A1* | 9/2015 | Inguva | ............... | G01R 31/3648 702/63 |
| 2015/0285866 A1* | 10/2015 | Frost | ................... | G01R 31/362 324/427 |
| 2015/0321572 A1* | 11/2015 | Koch | ................ | G01R 31/3648 701/22 |
| 2015/0364936 A1* | 12/2015 | Johnson | ............... | G01R 31/361 320/107 |
| 2016/0039419 A1* | 2/2016 | Wampler | .......... | B60W 30/1882 701/22 |

* cited by examiner

SYSTEMS AND METHODS FOR ESTIMATING BATTERY SYSTEM ENERGY CAPABILITY

TECHNICAL FIELD

This disclosure relates to systems and methods for estimating energy capability of a battery system. More specifically, but not exclusively, the systems and methods disclosed herein relate to estimating energy capability of a battery system based on a remaining state of charge of the battery system, an open circuit voltage curve associated with the battery system, and/or a voltage at which charge was removed previously from the battery system.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Information regarding energy stored in a battery system may be utilized in modeling battery system performance and/or in connection with battery system control and/or management decisions. For example, information regarding energy stored in a battery system included in a vehicle may be utilized in estimating a range of the vehicle. A battery state estimation ("BSE") system may be used to predict certain information regarding energy stored in a battery system that may be used in connection with estimating a range of a vehicle. Conventional methods for estimating a range of a vehicle may use a percentage of battery system's state of charge ("SOC") and/or an estimated vehicle range at full charge in connection with estimating the vehicle's range at a particular battery system SOC. Such methods, however, may not account for lower energy associated with units of charge at lower estimated SOCs of a battery system. Moreover, such methods may not account for profile severity and/or temperature changes that may affect a battery system's estimated SOC.

SUMMARY

Systems and methods disclosed herein may provide for improved estimation of information regarding battery system energy capability. Information regarding energy capability of a battery system may be utilized in connection with a variety of applications including, without limitation, modeling battery system performance and/or battery system control and/or management decisions. For example, in certain embodiments, information regarding energy capability of a battery system associated with a vehicle may be utilized in connection with estimating a range of the vehicle.

Consistent with embodiments disclosed herein, a state of energy ("SOE") of a battery system may be determined based, at least in part, on a remaining SOC of the battery system, an open circuit voltage ("OCV") curve associated with the battery system, and/or a voltage at which charge was removed previously from the battery system. In certain embodiments, the SOE may represent a ratio of energy remaining in a battery system to a total energy that may be stored by the battery system.

Among other things, the systems and methods disclosed herein may account for recent operating voltages of a battery system in connection with estimating future operating conditions and/or a SOE of the battery system. Embodiments may further allow for adaptations to an OCV curve associated with a battery system to be used in connection with determining an energy capability of the battery system. For example, in some embodiments, changes to an OCV curve as the battery system ages may be accounted for in connection with determining a remaining SOC of the battery system.

A method of determining an energy capability of a battery system in a vehicle may comprise determining a voltage offset of the battery system based on a comparison of an estimated OCV of the battery system and a measured voltage of the battery system. In certain embodiments, the voltage offset may be determined based on a difference between the estimated OCV of the battery system and the measured voltage of the battery system.

An estimated total pack energy and remaining pack energy of the battery system may be determined based on the voltage offset. For example, in certain embodiments, the estimated total pack energy of the battery system may be determined based on a result of an integration of a product of coulombs of the battery system and a voltage at which the coulombs will discharge from the battery system from a full SOC to empty. In some embodiments, the estimated total pack energy may be determined by integrating an OCV curve associated with the battery system (e.g., a curve relating a characterized OCV of the battery system with a characterized SOC) with the voltage offset. In certain embodiments, the integration may utilize a constant SOC step value (e.g., an interpolated value). In further embodiments, the integration may use a variable SOC step value determined based on characterization data points included in the OCV curve.

Similarly, the estimated remaining pack energy may be determined by integrating an OCV curve associated with the battery system with the voltage offset from a particular SOC (e.g., a present SOC). For example, in certain embodiments, determining the estimated remaining pack energy of the battery system may be based on a result of an integration of a product of coulombs of the battery system and a voltage and which the coulombs will discharge from the battery system from a present SOC to empty. In some embodiments, the integration may utilize a constant SOC step value (e.g., an interpolated value). In further embodiments, the integration may use a variable SOC step value determined based on characterization data points included in the OCV curve.

In certain embodiments, the estimated total and remaining pack energies may comprise estimated usable total and remaining pack energies associated with a usable SOE of the battery system. Based on the based on the estimated remaining pack energy and the estimated total pack energy, an energy capability (e.g., a usable energy capability) of the system may be determined by, for example, determining a ratio of the estimated remaining pack energy to the estimated total pack energy.

In certain embodiments, the method may further comprise implementing a control action in a vehicle associated with the battery system based on the determined energy capability. For example, an estimated range of the vehicle may be determined based on the determined energy capability, and a control action relating to an operation of the vehicle may be performed based on the estimated range.

In certain embodiments, the aforementioned method may be performed by a BSE system and/or any other computing system and/or implemented using a non-transitory computer-readable medium storing associated executable instructions. In some embodiments, the systems and methods disclosed herein may increase available battery power utilized in connection with battery system control and/or management decisions over a larger window of operating conditions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Systems and methods disclosed herein may provide for improved estimation and/or determination of information relating to an energy capability of a battery system. Energy capability determinations may be performed by a BSE system and/or another battery control, monitoring, and/or management system. In certain embodiments, a SOE of a battery system may be determined based, at least in part, on a remaining SOC of the battery system, an OCV curve associated with the battery system, and/or a voltage at which charge was removed previously from the battery system. In certain embodiments, a voltage offset may be determined based on a comparison of an estimated OCV and a measured voltage of a battery system. A total pack energy of a battery system may be estimated by integrating the OCV curve of the battery system with the determined voltage offset. A remaining pack energy of the battery system may be estimated by integrating the OCV curve from a measured pack SOC with the determined voltage offset. Based on the estimated total pack energy and the estimated remaining pack energy, an energy capability of the battery system may be determined (e.g., an energy capability expressed in terms of an SOE of the battery system). In some embodiments, the disclosed systems and methods for estimating an energy capability of a battery system may allow for improved estimation of vehicle range, thereby improving operation of an associated vehicle.

Figure 1:
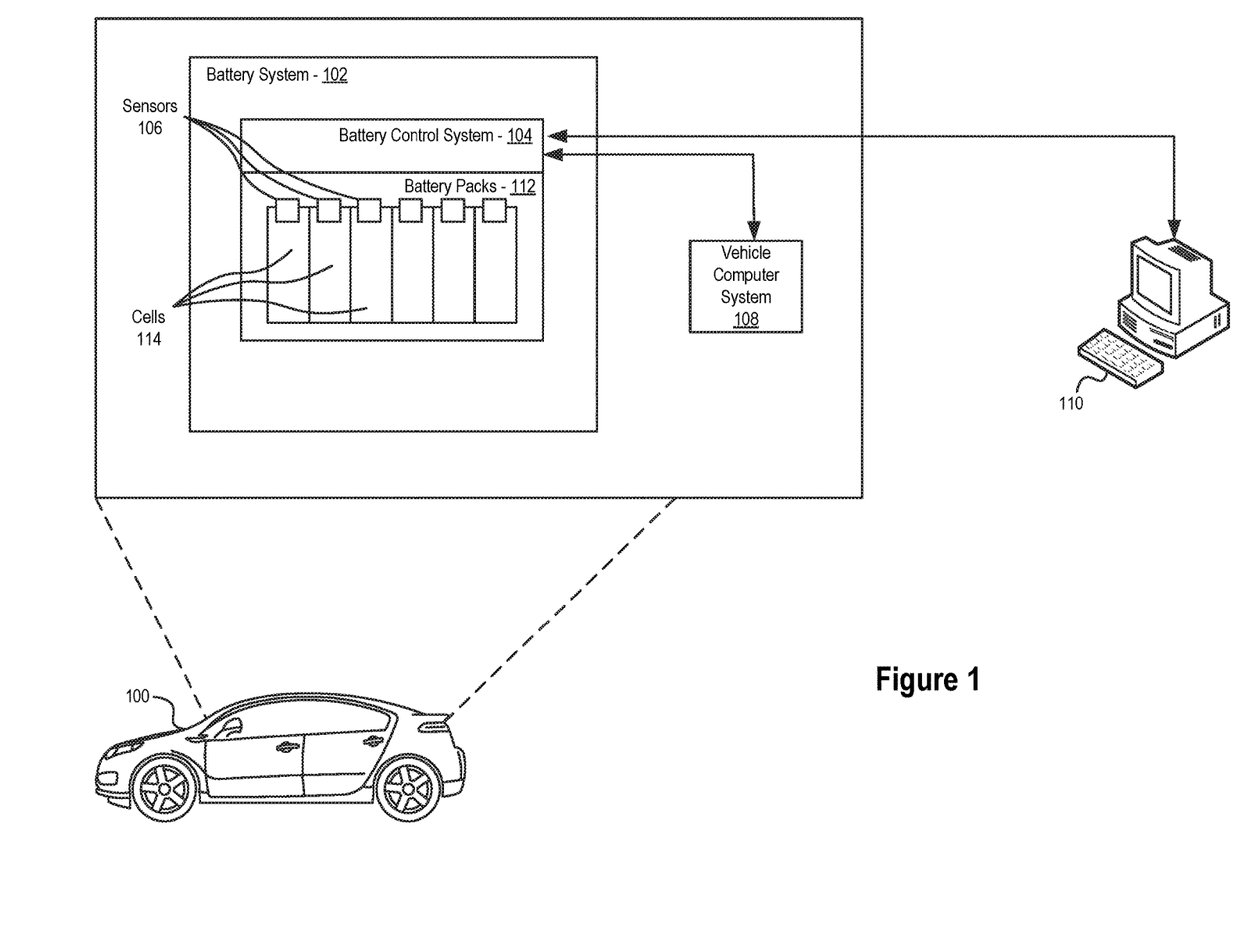
FIG. 1 illustrates an exemplary system for determining energy capability of a battery system included in a vehicle consistent with embodiments disclosed herein.

FIG. 1 illustrates an exemplary system for determining energy capability of a battery system 102 consistent with embodiments disclosed herein. In certain embodiments, the battery system 102 may be included in a vehicle 100. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to estimate, model, and/or otherwise determine battery system energy capability. In certain embodiments, the battery control system 104 may be communicatively coupled with one or more sensors 106 (e.g., voltage sensors, current sensors, and/or the like, etc.) and/or other systems (e.g., vehicle computer system 108, external computer system 110, etc.) configured to enable the battery control system 104 to monitor and control operations of the battery system 102 and/or perform certain methods disclosed herein. For example, sensors 106 may provide battery control system 104 with information used to estimate a SOC and/or a SOE, estimate an impedance, measure a current, measure voltage of a battery pack 112 and/or constituent battery cells 114, and/or any other information that may be utilized in connection with the disclosed embodiments.

The battery control system 104 may further be configured to provide information to and/or receive information from other systems (e.g., vehicle computer system 108) included in the vehicle 100. For example, the battery control system 104 may be communicatively coupled with an internal vehicle computer system 108 and/or an external computer system 110 (e.g., via a wired and/or wireless telecommunications system or the like). In certain embodiments, the battery control system 104 may be configured, at least in part, to provide information regarding the battery system 102 (e.g., information measured by sensors 106 and/or determined by control system 104) to a user, testing personnel, service personnel, and/or the like of the vehicle 100, the vehicle computer system 108, and/or the external computer system 110. Such information may include, without limitation, battery SOC, SOE, and/or state of health ("SOH") information, battery energy capability information, battery operating time information, battery cycle information, battery operating temperature information, vehicle range information, and/or any other information regarding the battery system 102 that may be utilized in connection with determining battery system energy capability information and/or information used in connection with battery system 102 and/or vehicle 100 management and/or control operations.

The battery system 102 may include one or more battery packs 112 suitably sized to provide electrical power to the vehicle 100. Each battery pack 112 may include one or more battery cells 114. The battery cells 114 may utilize any suitable battery technology or combination thereof. Suitable battery technologies may include, for example, lead-acid, nickel-metal hydride ("NiMH"), lithium-ion ("Li-Ion"), Li-Ion polymer, zinc-air, lithium-air, nickel-cadmium ("Ni-Cad"), valve-regulated lead-acid ("VRLA") including absorbed glass mat ("AGM"), nickel-zinc ("NiZn"), molten salt (e.g., a Na—$NiCl_2$ battery), and/or other suitable battery technologies. Each battery cell 114 may be associated with sensors 106 configured to measure one or more parameters (e.g., voltage, current, temperature, etc.) associated with each cell 114. Although FIG. 1 illustrates separate sensors 106 associated with each battery cell 114, in some embodiments a sensor configured to measure various electrical parameters associated with a plurality of cells 114 may also be utilized.

Information measured by sensors 106 may be provided to the battery control system 104 and/or one or more other systems (e.g., vehicle computer system 108 and/or external computer system 110). Using the information, the battery control system 104 and/or any other suitable system may coordinate the operation of battery system 102 (e.g., charging operations, discharging operations, balancing operations, etc.). The battery control system 104, vehicle computer system 108, external computer system 110, and/or any other suitable system implementing BSE methods may further utilize such information in connection with the disclosed embodiments to determine battery system 102 energy capability as part of monitoring, control, characterization, and/or modeling activities.

Figure 2:
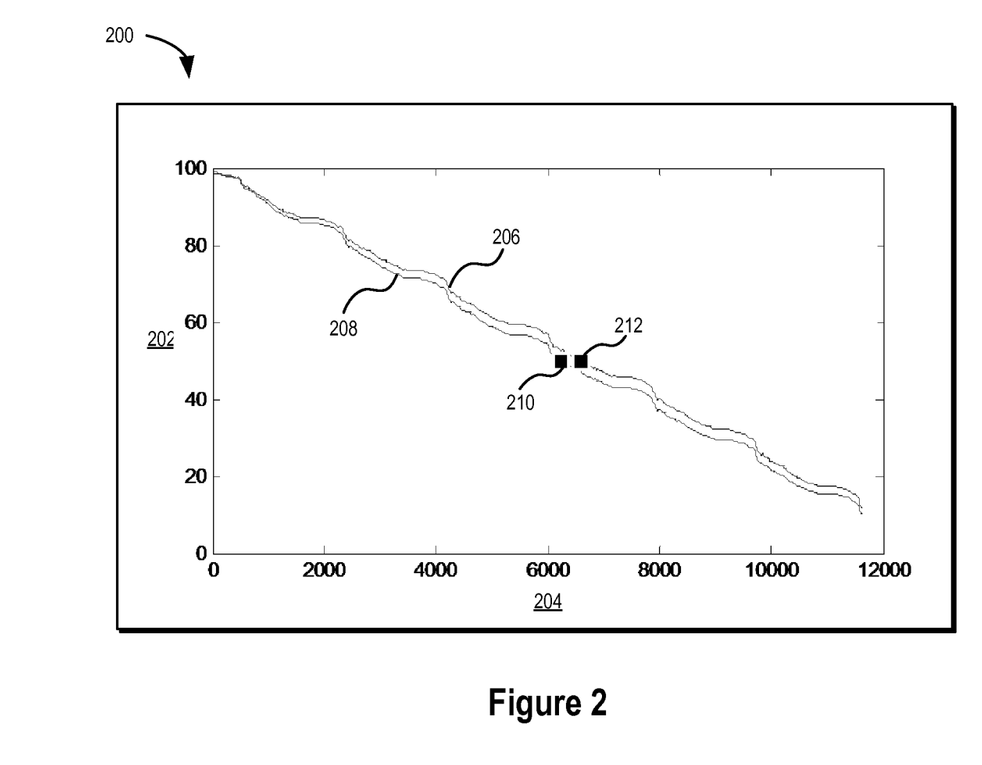
FIG. 2 illustrates a graph showing a relationship between a SOC and a SOE of an exemplary battery system over time consistent with embodiments disclosed herein.

FIG. 2 illustrates a graph 200 showing a relationship between a SOC and a SOE of an exemplary battery system over time 204 consistent with embodiments disclosed herein. Particularly, graph 200 illustrates an exemplary SOC curve 206 and a SOE curve 208 associated with an exemplary battery system, as measured by a percentage of SOC and SOE 202 relative to a total SOC and/or a total SOC respectively. As illustrated, in certain circumstances, 50% of a total SOE of a battery system, indicated by point 210, may be reached by a battery system during a discharge cycle earlier than 50% of a total SOC of the battery system, indicated by point 212. This may be attributed to, among other things, less energy included in a lower portion of an OCV curve associated with the battery system than in an upper portion of the OCV curve. Consistent with embodiments disclosed herein, such conditions may be accounted for to determine battery system 102 energy capability as part of monitoring, control, characterization, and/or modeling activities, thereby improving the accuracy of such determinations and/or activities.

Figure 3:
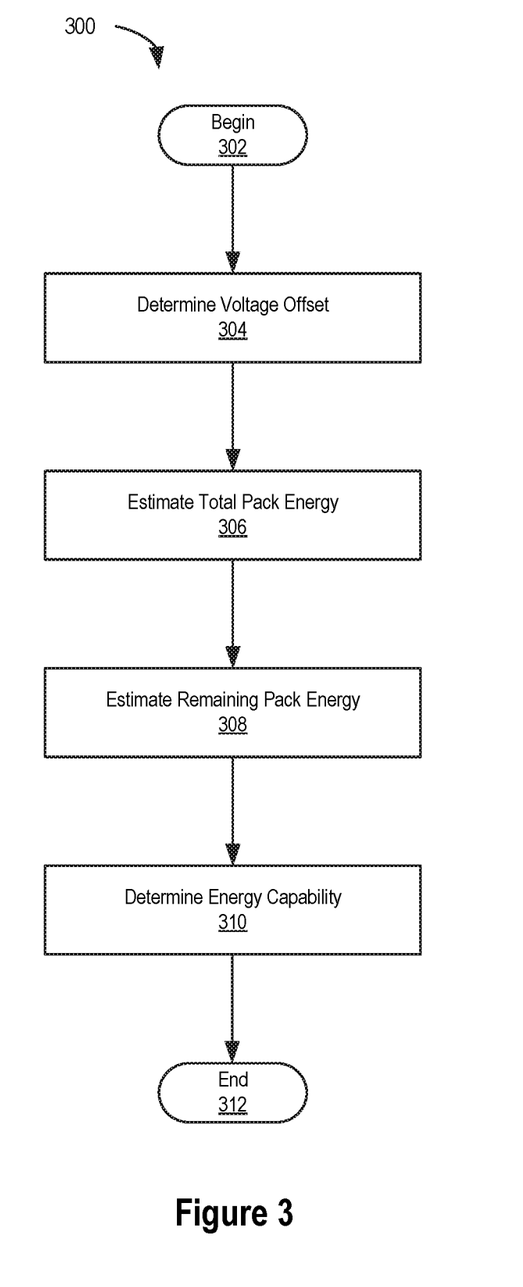
FIG. 3 illustrates a flow chart of an exemplary method for estimating energy capability of a battery system consistent with embodiments disclosed herein.

FIG. 3 illustrates a flow chart of an exemplary method 300 for estimating energy capability of a battery system (e.g., a battery system pack) consistent with embodiments disclosed herein. In certain embodiments, one or more of the illustrated elements of method 300 may be performed by and/or implemented using a battery control system, a vehicle computer system, an external computer system, and/or any other system or combination of systems configured implemented BSE methods and/or, monitor, model, and/or otherwise characterize energy capability of a battery system.

At 302, the method may initiate. At 304, a voltage offset may be determined based on a comparison of an estimated OCV of a battery system pack and a measured voltage of the battery system pack. In some embodiments, the estimated OCV of the battery system pack may be determined based on an OCV curve associated with the battery system pack. For example, in certain embodiments, the estimated OCV may be determined based on an OCV curve (e.g., a curve relating OCV to SOC) derived based on testing and/or characterization of a battery system pack. In certain embodiments, this comparison may comprise determining a difference between the estimated OCV and the measured voltage.

The voltage offset determined at 304 may be used in connection with estimating a total pack energy and a remaining pack energy of a battery system pack. For example, at 306, a total pack energy of a battery system may be estimated by integrating an OCV curve of the battery system pack with the voltage offset determined at 304. A remaining pack energy of the battery system may be estimated at 308 by integrating the OCV curve of the battery system pack from an estimated pack SOC and/or voltage with the voltage offset determined at 304. Based on the estimated total pack energy and the estimated remaining pack energy, an energy capability of the battery system may be determined at 310. In certain embodiments, the energy capability may be estimated by calculating a ratio of the estimated remaining pack energy to the estimated total pack energy and/or be expressed in terms of an SOE of the battery system pack.

In certain embodiments, the method 300 may utilize a portion of the OCV curve and/or an associated SOC window in connection with determining an energy capability of a battery system pack. For example, in some embodiments, a narrower window of SOC may be utilized in connection with determining total pack energy and remaining pack energy in method 300. As an example, a battery system pack may be utilized only between 30% and 60% actual SOC (e.g., to prolong life of the battery or the like). Accordingly, a usable SOC range (i.e., 0-100% usable SOC) may be defined between the 30% and 60% window of the actual SOC. A usable SOE and/or estimated usable energy capability may be determined using method 300 based on such a usable SOC range.

A variety of battery system performance modeling and/or battery system control and management activities may be performed based on the estimated energy capacity. For example, in certain embodiments, information regarding energy capability of a battery system pack associated with a vehicle determined using embodiments of method 300 may be utilized in connection with estimating a range of the vehicle and/or implementing a control action in connection with the same (e.g., displaying a range of the vehicle to an operator, varying drivetrain operating conditions such as speed and/or acceleration based on an estimated vehicle range, etc.). The method 300 may proceed to terminate at 312.

Figure 4:
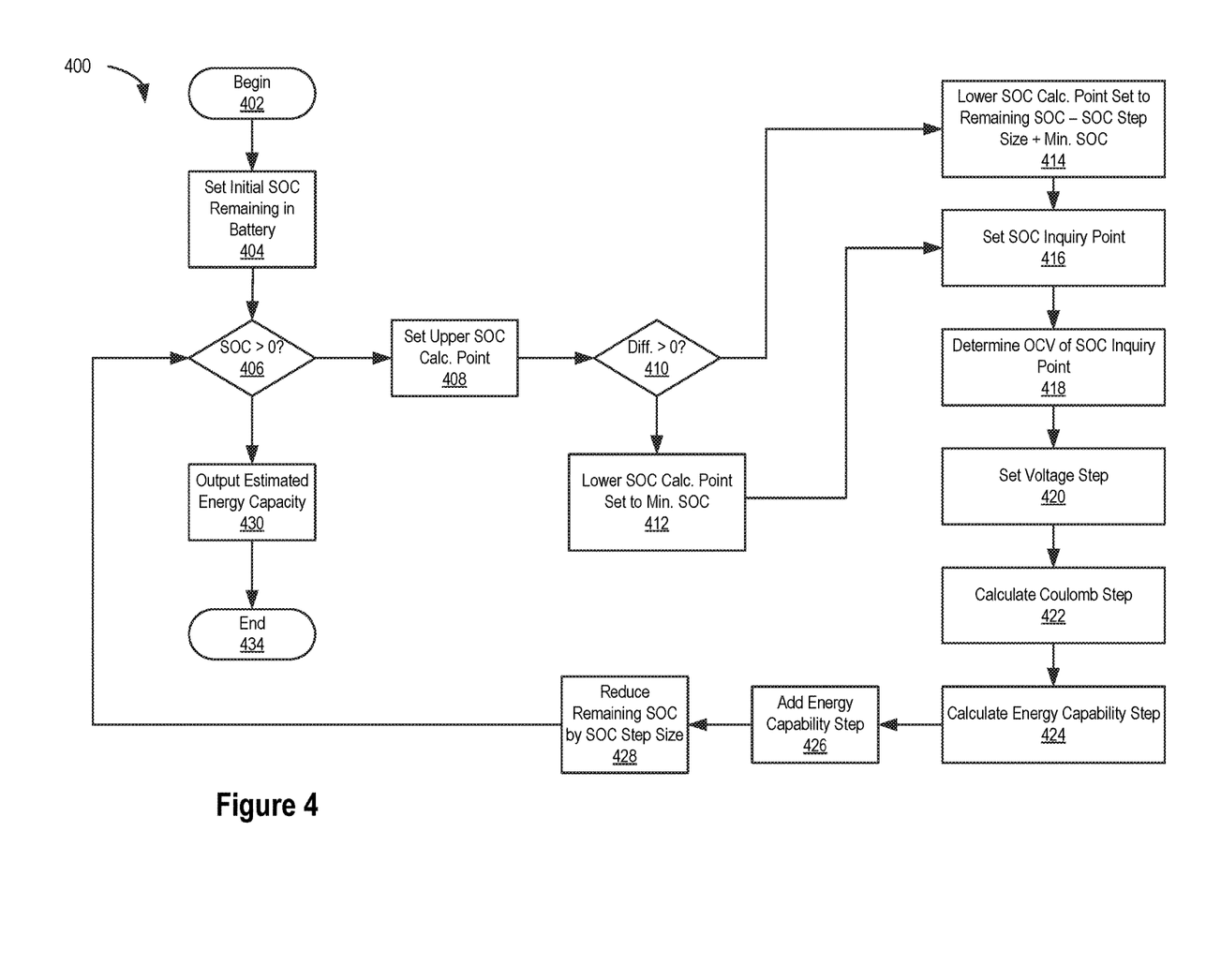
FIG. 4 illustrates a flow chart of an exemplary method for estimating a total pack energy and a remaining pack energy of a battery system consistent with embodiments disclosed herein.

FIG. 4 illustrates a flow chart of an exemplary method 400 for estimating a total pack energy and a remaining pack energy of a battery system consistent with embodiments disclosed herein. In certain embodiments, one or more of the illustrated elements of method 400 may be performed by and/or implemented using a battery control system, a vehicle computer system, an external computer system, and/or any other system or combination of systems configured implemented BSE methods and/or, monitor, model, and/or otherwise characterize energy capability of a battery system. In certain embodiments, one or more of the illustrated elements of method 400 may be configured to implement at certain elements of steps 306 and/or 308 illustrated in and described above in reference to FIG. 3. For example, in certain embodiments, certain elements of method 400 may facilitate an integration calculation used in connection with determining an amount of energy stored by a battery system pack.

At 402, the method may initiate. At 404, an initial SOC remaining in a battery system pack may be set at a difference between a present measured SOC (e.g., a SOC estimated based on measured voltage information or the like) and a minimum SOC of the battery system (e.g., a known minimum SOC or the like). An estimated energy capability of the battery system (e.g., expressed in terms of kW or the like) may also be set to zero.

At 406, it may be determined that the set SOC remaining in the battery system (i.e., the SOC initially set at 404) pack is greater than zero. If the set SOC remaining in the battery system is greater than zero, the method 400 may proceed to 408. At 408, an upper SOC calculation point used in the integration may be set to the sum of the set SOC remaining in the battery system and the minimum SOC of the battery system. At 410, a determination may be made whether a difference between the set SOC remaining in the battery system and the SOC step size used in connection with the integration is greater than zero. If the difference is greater than zero, the method 400 may proceed to 414, where a lower SOC calculation point used in the integration may be set to the set SOC remaining in the battery system minus the SOC step size plus the minimum SOC of the battery system. If the difference is not greater than zero, the method 400 may proceed to 412, where the lower SOC calculation point used in the integration may be set to the minimum SOC of the battery system.

In certain embodiments, the SOC step may be based on an OCV curve associated with the battery system. As discussed above, an OCV curve (e.g., a curve relating OCV to SOC) of a battery system may derived based on testing and/or characterization information relating to a battery system (e.g., the same and/or a similar battery system or the like). In some embodiments, the SOC step may be comprise interpolated SOC points at constant intervals between distinct testing and/or characterization data points along the OCV curve. In further embodiments, the SOC step may be variable and be associated with distinct testing and/or characterization data points along the OCV curve (e.g., points determined without interpolation). In certain embodiments, this may reduce processor intensive interpolation operations.

At 416, an SOC inquiry point may be set for the integration as a mid-point between the upper SOC calculation point and the lower SOC calculation point. An OCV of the SOC inquiry point may be determined at 418. In certain embodiments, the SOC inquiry point may be determined based on an OCV curve associated with the battery system (e.g., a discrete point associated with data used to generate the OCV curve and/or an interpolated point).

At 420 a voltage step may be set to the sum of the OCV of the SOC inquiry point and a polarization voltage of the battery system. In some embodiments, the voltage step may comprise a voltage associated with an SOC step and may represent an average voltage at which ampere-hours of the SOC step are discharged from the battery. The polarization voltage may be determined based on measured voltage of the battery system minus an estimated OCV voltage. This calculated voltage may be filtered to create an average voltage used as a polarization voltage. In certain embodiments, this polarization voltage may reflect, among other things, battery characteristics including resistance, temperature affects (e.g., colder temperatures may result in higher polarization voltage), driver action of an associated vehicle (e.g., hard acceleration may result in higher polarization), and/or the like.

At 422, a coulomb step may be calculated based on a product of the battery capacity and the difference between the upper SOC calculation point in terms of percentage of total capacity and the lower SOC calculation point in terms of percentage of total capacity. An energy capability step associated with the battery may be calculated as the product of the voltage step determined at 420 and the coulomb step determined at 422 at 424. At 426, the energy capability step may be added to the estimated energy capability of the battery system (e.g., expressed in terms of kW)

The set SOC remaining in the battery system may be reduced by the SOC step size at 428. The method 400 may proceed to integrate until it is determined at 406 that the set SOC remaining in the battery system pack is not greater than zero. Once this determination is made, the method 400 may proceed to 430, where the estimated energy capacity of the battery system may be output. The method 400 may proceed to terminate at 434.

Figure 5:
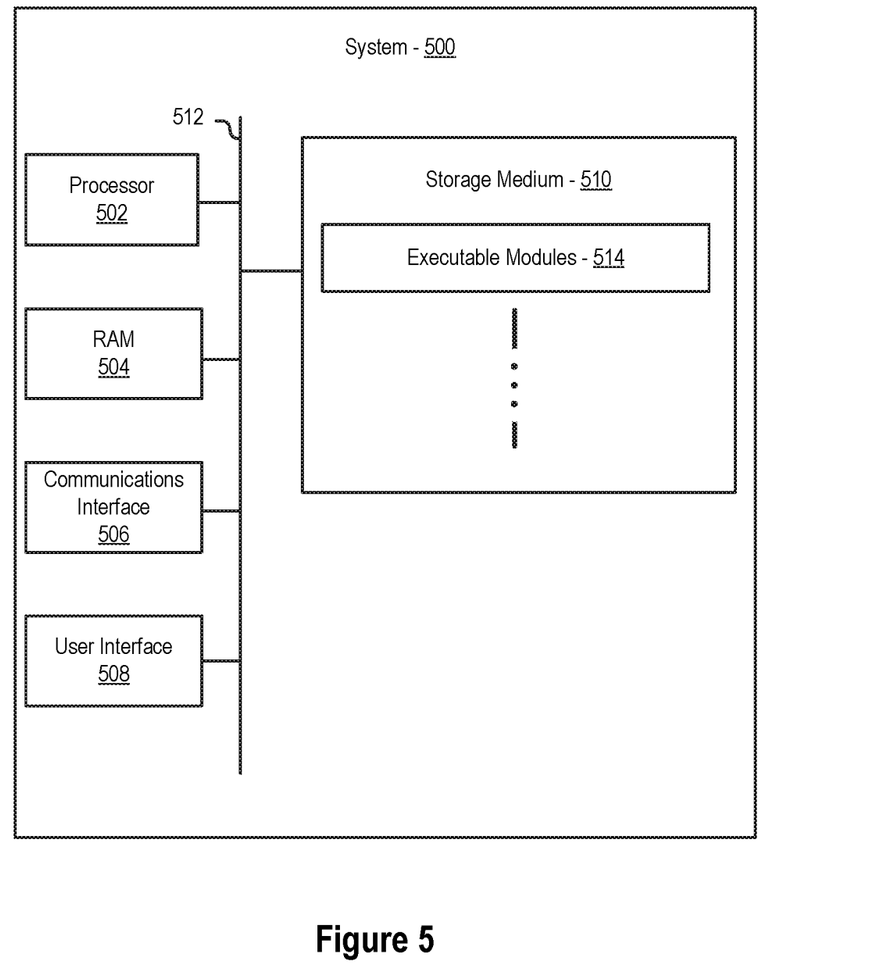
FIG. 5 illustrates an exemplary system for implementing certain embodiments of the systems and methods disclosed herein.

FIG. 5 illustrates an exemplary system 500 for implementing certain embodiments of the systems and methods disclosed herein. In certain embodiments, the computer system 500 may be a personal computer system, a server computer system, an on-board vehicle computer, a battery control system, an external computer system, and/or any other type of system suitable for implementing the disclosed systems and methods. In further embodiments, the computer system 500 may be any portable electronic computer system or electronic device including, for example, a notebook computer, a smartphone, and/or a tablet computer.

As illustrated, the computer system 500 may include, among other things, one or more processors 502, random access memory ("RAM") 504, a communications interface 506, a user interface 508, and a non-transitory computer-readable storage medium 510. The processor 502, RAM 504, communications interface 506, user interface 508, and computer-readable storage medium 510 may be communicatively coupled to each other via a common data bus 512. In some embodiments, the various components of the computer system 500 may be implemented using hardware, software, firmware, and/or any combination thereof.

User interface 508 may include any number of devices allowing a user to interact with the computer system 500. For example, user interface 508 may be used to display an interactive interface to a user. The user interface 508 may be a separate interface system communicatively coupled with the computer system 500 or, alternatively, may be an integrated system such as a display interface for a laptop or other similar device. In certain embodiments, the user interface 508 may be produced on a touch screen display. The user interface 508 may also include any number of other input devices including, for example, keyboard, trackball, and/or pointer devices.

The communications interface 506 may be any interface capable of communicating with other computer systems, peripheral devices, and/or other equipment communicatively coupled to computer system 500. For example, the communications interface 506 may allow the computer system 500 to communicate with other computer systems (e.g., computer systems associated with external databases and/or the Internet), allowing for the transfer as well as reception of data from such systems. The communications interface 506 may include, among other things, a modem, a satellite data transmission system, an Ethernet card, and/or any other suitable device that enables the computer system 500 to connect to databases and networks, such as LANs, MANs, WANs and the Internet.

Processor 502 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 502 may be configured to execute computer-readable instructions stored on non-transitory computer-readable storage medium 510. Computer-readable storage medium 510 may store other data or information as desired. In some embodiments, the computer-readable instructions may include computer executable functional modules 514. For example, the computer-readable instructions may include one or more functional modules configured to implement all or part of the functionality of the systems and methods described above. Specific functional models that may be stored on computer-readable storage medium 510 may include modules to test, monitor, and/or model energy capability of a battery system and/or any other module or modules configured to implement the systems and methods disclosed herein.

The system and methods described herein may be implemented independent of the programming language used to create the computer-readable instructions and/or any operating system operating on the computer system 500. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 500 may be in response to user commands, results of previous processing, or a request made by another processing machine. It will be appreciated that computer system 500 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of determining an energy capability of a battery system of a vehicle, the vehicle including a drivetrain and an electric drive motor connected to the drivetrain, the battery system including a battery pack operable to power the electric drive motor, and a battery controller operable to control the battery pack, the method comprising:
   control, by the battery controller of the vehicle, a discharge operation of the battery pack to power the electric drive motor;
   determining, by the battery controller based on one or more voltage signals received from one or more sensors for measuring battery system voltage, a voltage offset of the battery system based on a comparison of an estimated open circuit voltage ("OCV") of the battery system and a measured voltage of the battery system;
   determining a relationship between an OCV of the battery system and a state of charge ("SOC") of the battery system;
   determining, by the battery controller, a total pack energy of the battery system, wherein determining the total pack energy of the battery system comprises integrating a curve with the voltage offset, wherein the curve is associated with the relationship between the OCV of the battery system and the SOC of the battery system;

determining, by the battery controller, a remaining pack energy of the battery system by integrating a portion of the curve with the voltage offset, wherein the portion of the curve is associated with the relationship between the OCV of the battery system and the SOC of the battery system from an estimated pack SOC;

determining, by the battery controller, an energy capability of the battery system based on the remaining pack energy and the total pack energy; and implementing, by the battery controller, a control action based on the determined energy capability, the control action comprising adjusting a speed and/or acceleration operating condition of the drivetrain of the vehicle based on an estimated vehicle range associated with the determined energy capability.

2. The method of claim 1, wherein determining the voltage offset comprises determining a difference between the estimated OCV of the battery system and the measured voltage of the battery system.

3. The method of claim 1, wherein integrating the curve associated with the relationship between the OCV of the battery system and the SOC of the battery system comprises integrating the curve associated with the relationship between the OCV of the battery system and the SOC of the battery system based on a constant SOC step.

4. The method of claim 1, wherein integrating the curve associated with the relationship between the OCV of the battery system and the SOC of the battery system comprises integrating the curve associated with the relationship between the OCV of the battery system and the SOC of the battery system based on a variable SOC step determined based on characterization data points included in the curve associated with the relationship between the OCV of the battery system and the SOC of the battery system.

5. The method of claim 4, wherein integrating the portion of the curve associated with the relationship between the OCV of the battery system and the SOC of the battery system comprises integrating the portion of the curve associated with the relationship between the OCV of the battery system and the SOC of the battery system based on a constant SOC step.

6. The method of claim 4, wherein integrating the portion of the curve associated with the relationship between the OCV of the battery system and the SOC of the battery system comprises integrating the portion of the curve associated with the relationship between the OCV of the battery system and the SOC of the battery system based on a variable SOC step determined based on characterization data points included in the curve associated with the relationship between the OCV of the battery system and the SOC of the battery system.

7. The method of claim 1, wherein determining the energy capability of the battery system comprises determining a ratio of the estimated remaining pack energy to the estimated total pack energy.

8. The method of claim 1, wherein determining the remaining pack energy of the battery system comprises determining a result of an integration of a product of coulombs of the battery system and a voltage at which the coulombs will discharge from the battery system from a present SOC to empty.

9. The method of claim 1, wherein the estimated total pack energy comprises an estimated usable pack energy, the estimated remaining pack energy comprises an estimated usable remaining pack energy, and the energy capability comprises an estimated usable energy capability.

10. The method of claim 1, wherein adjusting the operating condition of the drivetrain of the vehicle comprises adjusting an operating speed of the vehicle.

11. The method of claim 1, wherein adjusting the operating condition of the drivetrain of the vehicle comprises adjusting an acceleration of the vehicle.

12. The method of claim 1, wherein the control action further provides generating a notification associated with the estimated vehicle range to an operator of the vehicle.

13. A motor vehicle, comprising:
a vehicle body;
a plurality of wheels attached to the vehicle body;
an electric drive motor attached to the vehicle body and operable to drive at least one of the wheels;
a battery pack attached to the vehicle body and operable to power the electric drive motor; and
a battery controller operable to control the battery pack, the battery controller being configured to:
control a discharge operation of the battery pack to power the electric drive motor;
determine a voltage offset of the battery pack based on a comparison of an estimated open circuit voltage (OCV) of the battery pack and a measured voltage of the battery pack;
determine a relationship between an OCV of the battery system and a state of charge ("SOC") of the battery system;
determine a total pack energy of the battery pack, including integrating a curve with the voltage offset, wherein the curve is associated with the OCV of the battery system;
determine a remaining pack energy of the battery system by integrating a portion of the curve with the voltage offset, wherein the portion of the curve is associated with the OCV of the battery system from an estimated pack SOC;
determine an energy capability of the battery system based on the remaining pack energy and the total pack energy; and
adjust a speed and/or acceleration operating condition of a drivetrain of the motor vehicle based on an estimated vehicle range associated with the determined energy capability.

14. The motor vehicle of claim 13, wherein determining the voltage offset includes determining a difference between the estimated OCV and the measured voltage.

15. The motor vehicle of claim 13, wherein integrating the curve associated with the OCV of the battery system includes integrating the curve based on a constant SOC step.

16. The motor vehicle of claim 13, wherein integrating the curve associated with the OCV of the battery system includes integrating the curve based on a variable SOC step determined based on characterization data points included in the curve associated with the OCV of the battery system.

17. The motor vehicle of claim 13, wherein integrating the curve associated with the OCV of the battery system includes integrating the curve based on a constant SOC step.

18. The motor vehicle of claim 13, wherein determining the energy capability of the battery system includes determining a ratio of the estimated remaining pack energy to the estimated total pack energy.

19. The motor vehicle of claim 13, wherein determining the remaining pack energy of the battery system includes determining a result of an integration of a product of coulombs of the battery system and a voltage at which the coulombs will discharge from the battery system from a present SOC to empty.

20. The motor vehicle of claim 13, wherein adjusting the operating condition of the drivetrain includes adjusting an operating speed and/or an acceleration of the vehicle.

\* \* \* \* \*